United States Patent [19]

Davis et al.

[11] Patent Number: 4,943,457
[45] Date of Patent: Jul. 24, 1990

[54] VACUUM SLICE CARRIER

[75] Inventors: Cecil J. Davis, Greenville; Robert Matthews, Plano, both of Tex.

[73] Assignee: Texas Instruments Incorporated, Dallas, Tex.

[21] Appl. No.: 96,216

[22] Filed: Sep. 4, 1987

Related U.S. Application Data

[63] Continuation of Ser. No. 60,991, Jun. 12, 1987, abandoned, which is a continuation of Ser. No. 790,918, Oct. 24, 1985, abandoned.

[51] Int. Cl.⁵ .................... B32B 3/00; B65D 17/42
[52] U.S. Cl. .................... 428/35.2; 111/50; 111/50.1; 111/500; 111/719; 118/724; 118/729; 118/730; 118/733; 414/220; 414/221; 414/222; 414/225; 414/416; 414/417; 427/294; 427/295
[58] Field of Search .................... 118/50; 220/20, 23; 206/334, 454, 485, 523, 585, 586, 587, 592, 593, 594, 829; 414/217, 222; 428/35

[56] References Cited

U.S. PATENT DOCUMENTS

| | | | |
|---|---|---|---|
| 3,874,525 | 4/1975 | Hassan et al. | 214/17 B |
| 3,902,615 | 9/1975 | Levy et al. | 214/301 |
| 3,968,885 | 7/1976 | Hassan et al. | 214/18 C |
| 4,091,919 | 5/1978 | MacLeod et al. | 206/213.1 |
| 4,339,039 | 7/1982 | Mykleby | 206/523 |
| 4,436,474 | 3/1914 | Grossman et al. | 414/417 |
| 4,449,885 | 5/1914 | Hertel et al. | 414/750 |
| 4,520,925 | 6/1985 | Johnson | 206/334 |
| 4,544,318 | 10/1985 | Nagatomo et al. | 414/222 |
| 4,555,024 | 11/1985 | Voss et al. | 206/454 |
| 4,574,950 | 3/1986 | Koe et al. | 206/334 |
| 4,582,191 | 4/1986 | Weigand | 198/339.1 |
| 4,588,086 | 5/1986 | Coe | 206/444 |

FOREIGN PATENT DOCUMENTS 373743  6/1932  United Kingdom .................. 200/62

Primary Examiner—Patrick Ryan
Attorney, Agent, or Firm—B. Peter Barndt; James T. Comfort; Melvin Sharp

[57] ABSTRACT

A vacuum-tight wafer carrier. The wafers are supported at each side by a slightly sloping shelf, so that minimal contact (line contact) is made between the wafer surface and the surface of the shelf. This reduces generation of particulates by abrasion of the surface of the wafer. The door of the vacuum carrier contains elastic elements to press the wafers lightly against the back of the carrier box. Thus, when the door of the box is closed, the wafers are restrained from rattling around, which further reduces the internal generation of particulates.

7 Claims, 3 Drawing Sheets

VACUUM SLICE CARRIER

This application is a continuation of application Ser. No. 060,991, filed Jun. 12, 1987, now abandoned which is a continuation of application Ser. No. 790,918, filed Oct. 24, 1985, now abandoned.

BACKGROUND AND SUMMARY OF THE INVENTION

The present invention relates to apparatus for manufacturing of integrated circuits.

One of the basic problems in integrated circuit manufacturing is particulates. This problem is becoming more and more difficult, because of two trends in integrated circuit processing: First, as device dimensions become smaller and smaller, it is necessary to avoid the presence of smaller and smaller particles. This makes the job of making sure that a clean room is really clean increasingly difficult. For example, a clean room which is of class 1 (has one particle per cubic foot) for particles of one micron and larger may well be class 1000 or worse if particle sizes down to 100 angstroms are counted.

Second, there is increased desire to use large size integrated circuit patterns: for example, integrated circuit sizes larger than 50,000 square mils are much more commonly used now than they were five years ago.

Thus, particulates are not only an extremely important source of loss in integrated circuit manufacturing, but their importance will increase very rapidly in the coming years. Thus, it is an object of the present invention to provide generally applicable methods for fabricating integrated circuits which reduce the sensitivity of the process to particulate contamination.

One of the major sources of particulate contamination is human-generated, including both the particles which are released by human bodies and the particles which are stirred up by equipment operators moving around inside a semiconductor processing facility (front end). To reduce this, a general trend in the industry for several years has been to make more use of automatic transfer operations, wherein a technician can, for example, place a cassette of wafers into a machine, and then the machine automatically transfers the wafers, one by one, from the cassette through the machine (to effect the processing steps necessary) and back to the cassette, without the technician's having to touch the wafers.

However, the efforts in this direction have served to highlight the importance of a second crucial source of particulates, which is particulates generated internally by the wafers and/or transfer mechanism. That is, when the surface of the wafer jostles slightly against any other hard surface, some particulates (of silicon, silicon dioxide, or other materials) are likely to be released. The density of particulates inside a conventional wafer carrier is typically quite high, due to this source of particulates.

The present invention advantageously solves this problem, by providing a wafer carrier wherein particulate generation during transport is reduced in several ways. First, the door of the vacuum carrier contains elastic elements to press the wafers lightly against the back of the carrier box. Thus, when the door of the box is closed, the wafers are restrained from rattling around, which reduces the internal generation of particulates. Second, the wafers are supported at each side by a slightly sloping shelf, so that minimal contact (line contact) is made between the wafer surface and the surface of the shelf. This reduces generation of particulates by abrasion of the surface of the wafer.

The present invention not only reduces generation of particulates in the carrier during transport and storage, but also advantageously reduces transport of particulates to the wafer face during transport and storage, by carrying the wafers face down, under a high vacuum. The prior art is not know to address this problem at all.

The present invention provides greatly improved low particulate wafer handling and loading operations, wherein wafers can be transported, loaded and unloaded without ever seeing atmospheric or even low vacuum conditions. This is extremely useful, because, at pressures of less than about 10 to the $-5$ Torr, there will not be enough Brownian motion to support particulates of sizes larger than about 10 nm, and these particulates will fall out of this low-pressure atmosphere relatively rapidly.

FIG. 3 shows the time required for particles of different sizes to fall one meter under atmospheric pressure. Note that, at a pressure of 10 to the $-5$ Torr (1E-5 Torr) or less, even 10 nm particles will fall one meter per second, and larger particles will fall faster. (Large particles will simply fall ballistically, at the acceleration of gravity.) Thus, an atmosphere with a pressure below 10 to the $-5$ Torr means fthat particles ten nanometers or larger can only be transported ballistically, and are not likely to be transported onto the critical wafer surface by random air currents or Brownian drift.

The relevance of this curve to the present invention is that the present invention is the first to provide a way to transport wafers from one processing station to another, including loading and unloading steps, without ever exposing them to higher pressures than 1E-5 Torr. This means that the wafers are NEVER exposed to airborne particulates, from the time they are loaded into the first vacuum processing station (which might well be a scrubbing and pumpdown station) until the time when processing has been completed, except where the processing step itself requires higher pressures (e.g. in conventional photolithography stations or for wet processing steps). This means that the total possibilities for particulate collection on the wafers are vastly reduced.

The present invention provides a vacuum-tight wafer carrier, which can be used with a load lock which includes an apparatus for opening a vacuum wafer carrier under vacuum, for removing wafers from the carrier in whatever random-access order is desired, and for passing the wafers one by one through a port into an adjacent processing chamber, such as a plasma etch chamber. Moreover, the load lock preferably used with the present invention is able to close and reseal the wafer carrier, so that the load lock itself can be brought up to atmospheric pressure and the wafer carrier removed, without ever breaking the vacuum in the wafer carrier.

Another advantage of the wafer carrier of the present invention is that this wafer carrier CANNOT inadvertently be opened outside a clean room. A substantial yield problem in conventional clean room processing is inadvertent or careless exposure of wafers to particulates by opening the wafer carrier outside the clean room environment. However, with the wafer carrier of the present invention this is inherently impossible, since the pressure differential on the door of the carrier holds it firmly shut except when the carrier is in vacuum. This is another reason why the present invention is advantageous in permitting easy transport and storage of wafers outside a clean room environment.

According to the present invention there is provided: A wafer carrier comprising: a box having first and second sidewalls and a top and a bottom and a back side, said sidewalls of said box each having plural ledges thereon defining slots in said box to hold wafers of a predetermined size, a door closable to cover said box, said door having an elastic element on the inner surface thereof, said elastic element holding wafers of said predetermined size against the back of said box when said door is closed.

According to the present invention there is provided: A wafer carrier comprising: a box having sidewalls and a top and a bottom and a back side, said sidewalls of said box each having plural ledges thereon defining slots in said box to hold wafers of a predetermined size, said ledges on said sidewalls having at least one surface thereof sloped to be at least 5 degrees out of parallel with the plane of said bottom of said box and also at least 5 degrees out of parallel with the plane of said top of said box.

According to the present invention there is provided: A wafer carrier comprising: a box having first and second sidewalls and a top and a bottom and a back side, said sidewalls of said box each having plural ledges thereon defining slots in said box to hold wafers of a predetermined size, said back side having a flat surface portion on the interior of of said box; and a door closable to cover said box, said door having an elastic element on the inner surface thereof, said elastic element when said door is closed being spaced from said flat surface portion of back side of said box by less than the width of said predetermined wafer size.

According to the present invention there is provided: A method of transporting integrated circuit wafers during fabrication, comprising the steps of: carrying said wafers under vacuum in a vacuum-tight box.

According to the present invention there is provided: A method of transporting integrated circuit wafers during fabrication, comprising the steps of: carrying said wafers under vacuum in a vacuum-tight box, wherein said wafers are carried in a substantially face-down position.

According to the present invention there is provided: A method of transporting integrated circuit wafers during fabrication, comprising the steps of: carrying said wafers under vacuum in a vacuum-tight box.

According to the present invention there is provided: A method of transporting integrated circuit wafers during fabrication, comprising the steps of: carrying said wafers under vacuum in a vacuum-tight box, wherein said box comprises first and second sidewalls and a top and a bottom and a back side and a door closable to make a vacuum-tight seal to said box, said sidewalls of said box each having plural ledges thereon defining slots in said box to hold wafers of a predetermined size, said door having an elastic element on the inner surface thereof, said elastic element holding wafers of said predetermined size against the back of said box when said door is closed.

According to the present invention there is provided: A method of transporting integrated circuit wafers during fabrication, comprising the steps of: carrying said wafers under vacuum in a vacuum-tight box, wherein said box comprises first and second sidewalls and a top and a bottom and a back side and a door closable to make a vacuum-tight seal to said box, said sidewalls of said box each having plural ledges thereon defining slots in said box to hold wafers of a predetermined size, said ledges on said sidewalls having at least one surface thereof sloped to be at least 5 degrees out of parallel with the plane of said bottom of said box and also at least 5 degrees out of parallel with the plane of said top of said box.

According to the present invention there is provided: A method of transporting integrated circuit wafers during fabrication, comprising the step of: carrying said wafers under vacuum in a vacuum-tight box, wherein said wafers are carried in a substantially face-down position, and wherein said box comprises first and second sidewalls and a door closable to make a vacuum-tight seal to said box, said sidewalls of said box each having plural ledges thereon defining slots in said box to hold wafers of a predetermined size, said door having an elastic element on the inner surface thereof, said elastic element holding wafers of said predetermined size against the back of said box when said door is closed.

According to the present invention there is provided: A method of transporting integrated circuit wafers during fabrication, comprising the steps of: carrying said wafers under vacuum in a vacuum-tight box, wherein said box comprises first and second sidewalls each having plural ledges thereon defining slots in said box to hold wafers of a predetermined size, said ledges on said sidewalls having at least one surface thereof sloped to be at least 5 degrees out of parallel with the plane of said bottom of said box and also at least 5 degrees out of parallel with the plane of said top of said box.

BRIEF DESCRIPTION OF THE DRAWINGS

The present invention will be described with reference to the accompanying drawings, wherein.

DESCRIPTION OF THE PREFERRED EMBODIMENTS

The present invention provides major new concepts in semiconductor processing apparatus. The presently preferred embodiments will now be discussed in great detail, but it must be appreciated that the novel concepts which are included in these embodiments could also be used in many other embodiments, and the scope of the invention is not delimited by the particular examples shown.

Figure 1:
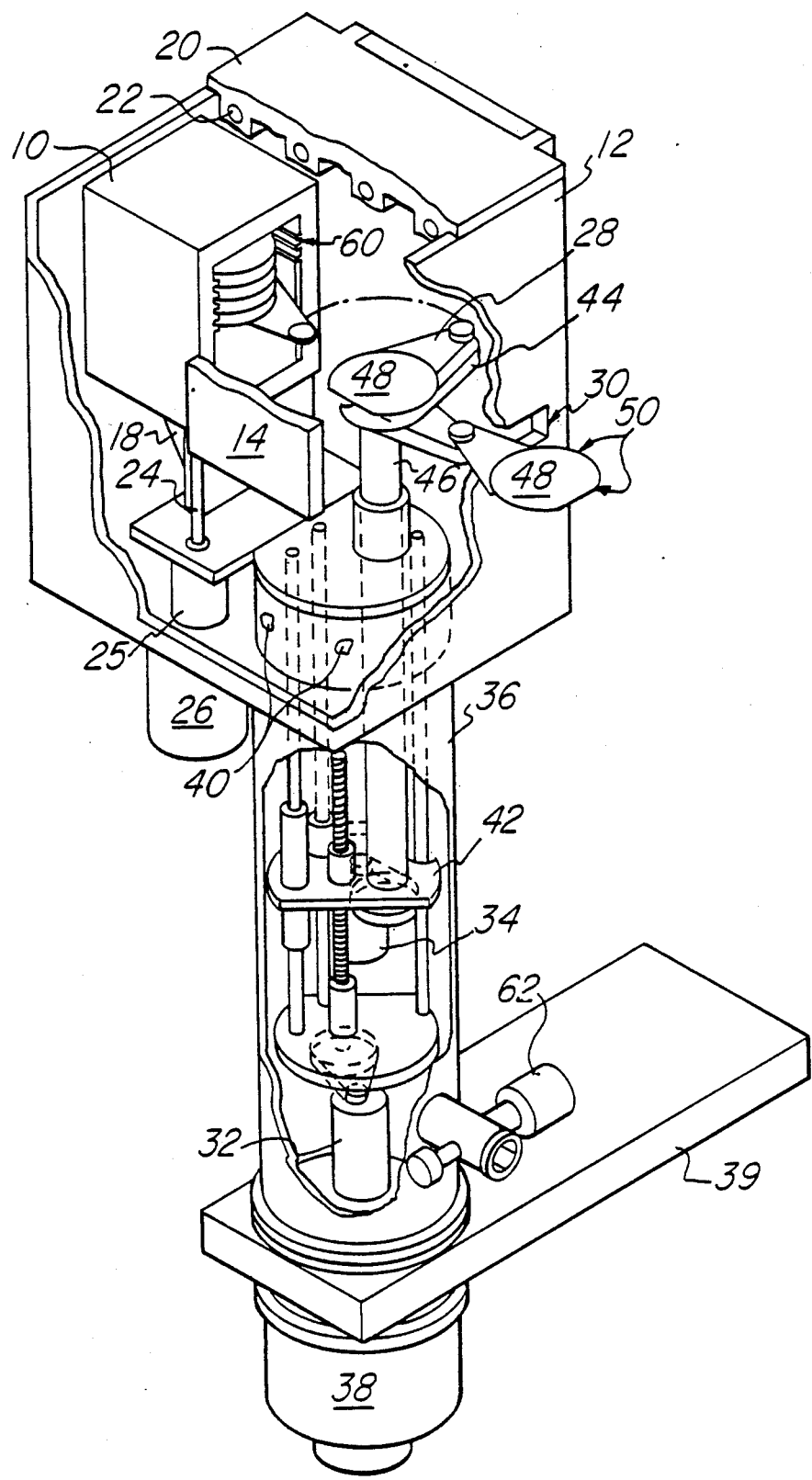
FIG. 1 shows a sample embodiment of a vacuum load lock suitable for use with the present invention, with a wafer carrier according to the present invention shown therein in the process of loading and unloading.

FIG. 1 shows a sample embodiment of the invention. This embodiment shows a sample embodiment of the wafer carrier 10 inside a vacuum load lock chamber 12, which is suitable for loading and unloading the wafer carrier under vacuum. The wafer carrier 10 is also shown, in slightly greater detail, in FIG. 5.

The carrier 10 is shown with its door 14 standing open. The door 14 preferably has a vacuum seal 13 where it mates with the body of the carrier 10, so that the wafer carrier can be carried around under atmospheric pressure for at least several days (preferably at least several tens of days) without enough leakage to raise the internal pressure above 10 to the −5 Torr.

Figure 2:
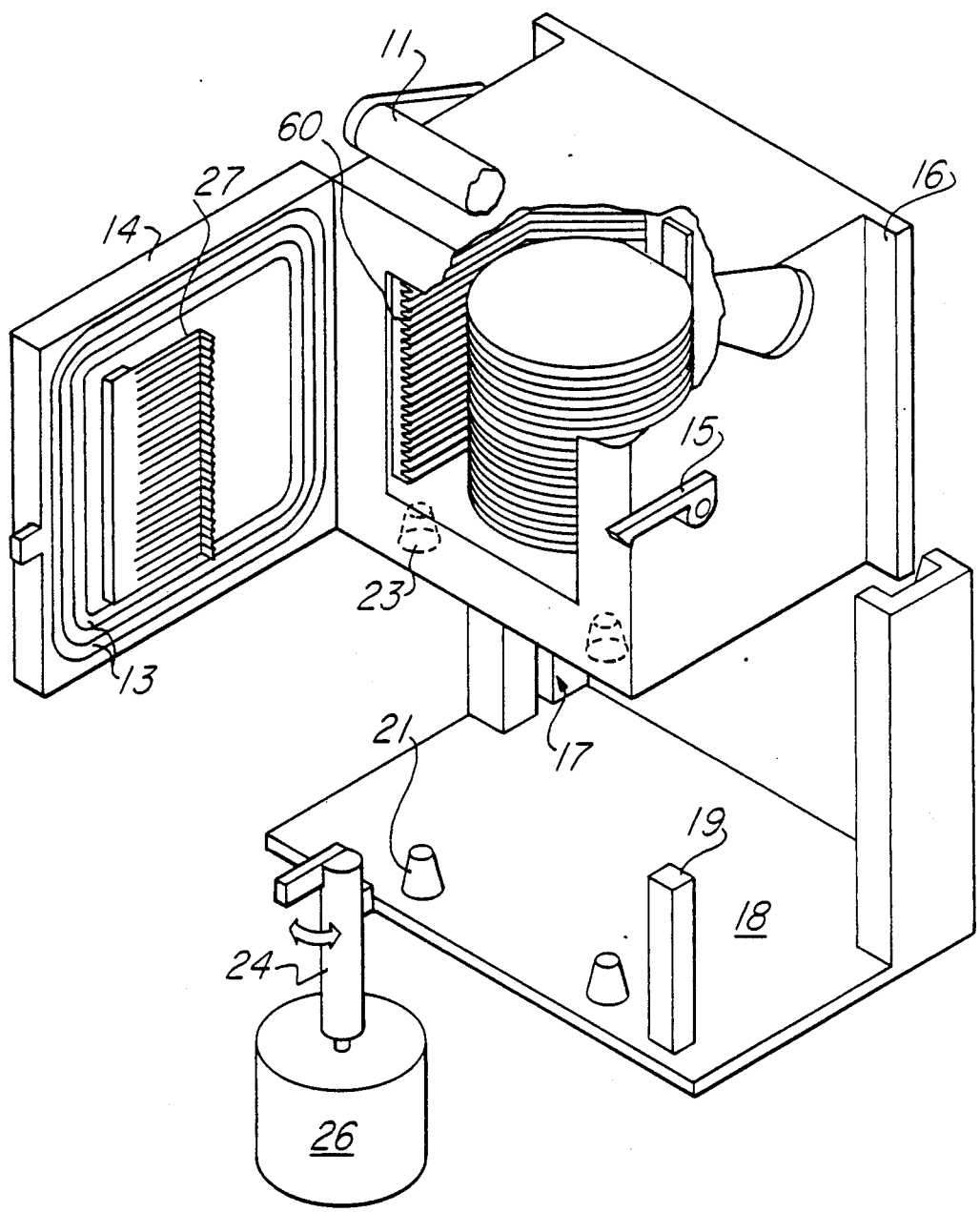
FIG. 2 shows a closer view of a sample embodiment of the wafer carrier 10, docked onto the platform 18 inside the load lock 12 to provide mechanical registration of the position of the wafers.
Figure 3:
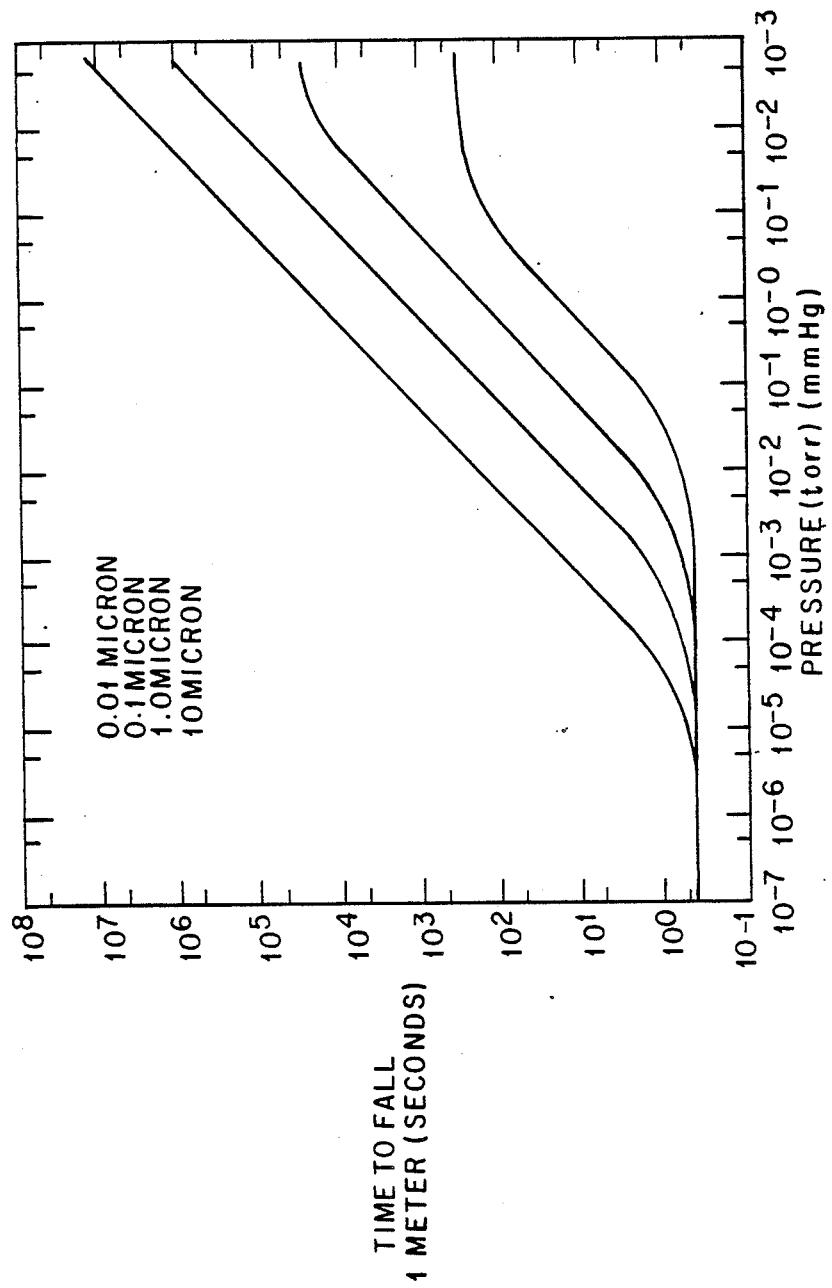
FIG. 3 shows a graph of the time required to fall through air at various pressures for various particulate sizes.

The wafer carrier 10 is adapted to dock with a platform 18 (which is only partially visible in FIG. 1, but is shown in more detail in FIG. 2), so that, when a technician places a wafer carrier 10 inside the load lock 12, the position of the carrier 10 will be accurately known. In the presently preferred embodiment the wafer carrier 10 has ears 16 which engage vertical slots 17 fixed to the position registration platform 18, so that the technician can slide the carrier into these slots until it rests on the platform 18, and thereby assure that the position of the carrier 10 is definitely known. In the presently preferred embodiment, the platform 18 includes two tapered pins 21 (one conical and one wedge-shaped) positioned to engage tapered holes 23 in the underside of the wafer carrier 10, but a wide variety of other arrangements could be used to assure mechanical registration, as will be obvious to any ordinarily skilled mechanical engineer.

The carrier 10 preferably has a safety catch 15 on it which secures the door 14 from falling open. However, under normal conditions of transport, this safety catch is not needed, since atmospheric pressure holds the door 14 shut against the internal vacuum of the carrier. When the carrier 10 is placed inside the load lock 12, a fixed finger 19 will push against the safety catch 15 to release it, so that the door 14 can be opened.

When the carrier 10 is docked with the platform 18, the door 14 will also be engaged with the door opening shaft 24. Preferably the door 14 has a shallow groove in its underside, which mates with a finger and arm 25 on the top of the door opening shaft 24. Thus, after the load lock has been pumped down so that differential pressure no longer holds the door 14 closed, the door can be opened by door opening shaft 24.

After the technician has placed the wafer carrier 10 in the vacuum load lock 12 and closed the load lock lid 20, a high pressure purge (with dry nitrogen or other clean gas) is preferably applied through manifold 22 inside load lock lid 20. This high pressure purge provides vertical flow, to tend to transport particles downward, and also helps to blow off some of the large particles which will have collected on the wafer carrier 10 during its exposure to atmospheric conditions. After this initial purge stage (e.g. for 30 seconds or more), the chamber is then slowly pumped down to 10 to the −4 Torr or less. This pump down stage is preferably relatively slow, in order not to stir up random particulates. That is, while low pressures do permit particles to fall from the air, those particles will still be available on the bottom of the chamber, and must not be stirred up if this can be avoided.

In order to make sure that the airborne particulates have actually fallen out of the chamber air, the interior of the vacuum load lock will then preferably be allowed to stay at 10 to the −4 or 10 to the −5 Torr for a few seconds, to make sure that all of the particles which are able to fall out of the air will do so.

It may also be advantageous, as an optional modified embodiment of the invention, to use a sloped bottom and/or polished sidewalls for the load lock, to reduce the population of particulates sticking to the sidewalls and bottom which may be sent flying by mechanical vibration. The present invention greatly reduces the problems of airborne particulates. which has always been the dominant type of particulate transport, so that the problem of ballistically transported particulates can now be usefully addressed. A related optional modification is the use of an insitu vacuum particle counter in the upper chamber, so that any increase in particle population the critical volume can be detected. Such an in-situ particle counter can be built using a resonant circuit to measure charge transfer in a high-voltage vacuum-gap capacitor, or (for particles sufficiently large) by using a laser-driven optical cavity with a multiply-folded optical path, or by other means.

Optionally, this particulate sensor (or a second particulate sensor which is better adapted to sensing particulates at higher pressures) can be used to control the nitrogen shower prior to initial pumpdown. That is, instead of doing the nitrogen shower simply for a fixed duration, it may be protracted if the particulate monitor shows that the box was in an unusually dirty environment. It may even be desirable to pump the load lock down to a soft vacuum (using the roughing pump) and then bleed gas through the nitrogen shower ports, to create a downward flow. It may also be desirable to cycle the load lock from a soft vacuum (e.g. 100 milli-Torr or so) up to atmospheric again, by initiating another nitrogen shower cycle, if the particulate monitor indicates that that particulate level is still excessive at the time the load lock has reached a given soft vacuum pressure.

Note that vacuum gauges 62 are preferably connected to the interior of the load lock chamber. Preferably the sensors 62 include a high-pressure gauge (such as a thermocouple), a low pressure gauge (such as an ionization gauge), and a differential sensor which accurately senses when the load lock interior pressure has been equalized with the atmosphere. Thus, the door of a carrier 10 is not opened until these gauges indicate that a good vacuum has been achieved inside the load lock.

After a roughening pump (not shown) has brought the chamber down to a soft vacuum, the gate valve 39 can be opened to connect the turbomolecular pump 38 to the interior of the load lock, and the turbomolecular pump 38 can then be operated to bring the pressure down to 10 to the −5 Torr or less.

At this point, the pressures inside the wafer carrier 10 and the vacuum load lock 12 are more or less equalized, and the door 14 can be activated by operating motor 26, which is connected to door opening shaft 24 through vacuum feedthrough 25.

Preferably two sensor switches are also included inside vacuum load lock 12, to ascertain when door 14 is in its fully opened position, and when door 14 is fully shut. Thus, after the load lock 12 has been pumped down and allowed to sit for a few seconds, door opening shaft 24 is rotated to open the door 14, until the sensor detects that the door is fully open. During this time, the transfer arm 28 is preferably kept in its home position at an elevation below the bottom of the door, so that the door 14 has clearance to open. After the sensor detects that the door 14 is fully open, the tranfer arm can begin to operate.

The transfer arm 28 preferably has two degrees of freedom. One direction of motion permits the transfer arm 28 to reach into carrier 10 or through port 30 into the adjacent processing chamber. The other degree of freedom corresponds to vertical motion of the transfer arm 28, which permits selection of which wafer inside the carrier 10 is to be removed, or which slot a wafer is to be placed into.

In the presently preferred embodiment, an elevator drive motor 32 is used to control the elevation of the transfer arm 28, and arm drive motor 34 controls the extension and retraction of the transfer arm 28. Note that both of these motors, in the presently preferred embodiment, do not require vacuum feedthrough, but are housed inside the exhaust manifold 36 which leads from the load lock 12 to the vacuum pump 38, which may be, for example, a turbo molecular pump. Moreover, the exhaust manifold 36 does not open directly into the load lock chamber 12, but instead has apertures 40 around its top. That is, the exhaust manifold 36 is preferably configured so that there is not any line of sight path from the drive motors 32 or 34 or from the pump 38 into the load lock chamber. This helps to reduce ballistic transport of particulates from these moving elements into the load lock chamber.

The elevator drive motor 32 is preferably connected to drive a sub-platform 42 up and down, and the arm drive motor 34 is preferably mounted on this platform 42.

In the presently preferred embodiment, a linkage is used inside the rotatable transfer arm support 44, to permit the transfer arm 28 to move very compactly. The transfer arm support 44 is preferably connected to a rotating rod which is driven by the arm drive motor 34, but the arm support 44 is preferably mounted on a tubular support 46 which does not rotate. An internal chain and sprocket linkage is preferably used so that the joint between arm support 44 and transfer arm 28 moves with twice the angular velocity of the joint between arm support 44 and tubular support 46. (Of course, many other mechanical linkages could alternatively be used to accomplish this.) This means that, when the arm support 44 is in its home position, a supported wafer 48 will be approximately above the tubular support 46, but when the arm support 44 is rotated 90 degrees with respect to the tubular support 46, the transfer arm 28 will have been rotated 180 degrees with respect to the arm support 44, so the transfer arm can either extend straight into the wafer carrier 10 or else straight through the port 30 into the adjacent processing chamber. This linkage is described in greater detail in U.S. patent application No. 664,448, filed 10/24/84 (TI-10841), which is hereby incorporated by reference.

The transfer arm 28 preferably is a thin piece of spring steel, e.g. 0.030 inch thick. The transfer arm has 3 pins 50 on it to support the wafer. Each pin 50 preferably includes a small cone 52 on a small shoulder 54. The cone 52 and shoulder 54 are preferably made of a material which is soft enough to not scratch silicon. In the presently preferred embodiment, these portions (which are the only portions of transfer arm 28 which will actually touch the wafers being transported) are preferably made of a high-temperature plastic (i.e. a plastic with a relatively low propensity to outgas under vacuum) such as Ardel (a thermoplastic phenyl acrylate, made by Union Carbide) or Delrin. Note that the use of cones 52 at the center of the locating pins 50 permits very slight misalignments of the wafer to the transfer arm 28 to be corrected: in other words the system of water transport according to the present invention is a stable mechanical system, wherein small misalignments during successive operations will not accumulate, but will be damped out.

Note that, in the positioning of the wafer 48 as shown, one of the three pins 50 rests against the flat portion of the wafer's circumference. This means that, in this embodiment, the three pins 50 on the transfer arm 28 do not define a circle of the same diameter as the diameter of the wafers 48 to be handled.

To assure that the wafer flats do not interfere with accurate handling of the wafers, the box 10 preferably has a flat surface on its interior back side with the flats of the wafers 48 will rest against. An elastic element 27 on the inside surface of the door 14 pushes each wafer against this flat surface when the door 14 is closed, so that the wafers do not rattle around in transit. This also assures that, when the door 14 is opened, the location of the flat on each wafer 48 is accurately known.

Thus, after the box 10 is in the chamber 12 with its door 14 open, elevator drive motor 32 is operated to bring the transfer arm 28 to just below the height of the first wafer which it is desired to remove, and arm drive motor 34 is then operated to extend the transfer arm 28 into the interior of the box 10. By operating the elevator drive motor 32 briefly, the transfer arm 28 is then raised, in this position, until the three pins 50 around its circumference lift the desired wafer off of the ledges 60 on which it has been resting inside the carrier box 10.

Note that the ledges 60 preferably have tapered surfaces rather than flat surfaces, so that contact between the ledges 60 and the wafer 48 resting on them is a line contact rather than an area contact, and is limited to the edge of the wafer. This is, in prior art wafer carriers area contact may be made over a substantial area, of many square millimeters, but the "line contact" used in the present invention makes contact only over a much smaller area, typically of a few square millimeters or less. An alternative definition of the "line contact" used in this embodiment of the invention is that the wafer support contacts the surface of the wafer only at points which are less than one millimeter from its edge.

Thus, by raising the transfer arm 28, the desired wafer 48 will be picked up, and will be resting on the cones 52 or shoulders 54 of the three pins 50 on the transfer arm 28.

In the presently preferred embodiment, the ledges 60 have a center-to-center spacing of 187 inches inside the box. This center spacing, less the thickness of the wafers, must allow clearance enough for the height of the transfer arm 28 plus the pins 50, but need not be much more. For example, in the presently preferred embodiment, the transfer arm is about 0.080 inch thick, including the height of the cones 52 on the transfer pins 50. The wafers themselves will be about 0.021 inch thick (for the presently preferred embodiment wherein 4 inch wafers are used) so that about 0.085 inch clearance is available. Of course, larger diameter wafers will have greater thicknesses, but the present invention is eminently suited to such larger diameter wafers, since the size of the box 10 and the center spacing of the ledges 16 inside the box 10 can simply be scaled appropriately.

Thus, after the transfer arm 28 has picked up a desired wafer 48, the arm drive motor 34 is operated to bring the transfer arm 28 to the home position.

The elevator drive motor 32 is then operated to bring the transfer arm 28 to a height where it can reach through the port 30.

Port 30 is preferably covered by an isolation gate (not shown in FIG. 1) which seals the port 30 without making sliding contact. (Again, the absence of sliding contact is advantageous to reduce internally generated particulates.)

In the present embodiment, the isolation gate over port 30 is preferably operated an air cylinder, but a stepper motor may be used instead. Thus, a total of four motors is used: two which use vacuum feedthroughs, and two which are preferably contained inside the exhaust manifold 36.

The arm drive motor is now operated again, to extend the transfer arm 28 through port 30 into the adjacent processing chamber.

The adjacent processing chamber may be any one of many different kinds of processing stations. For example, this station may be an implanter, a plasma etch, or a deposition station.

In the presently preferred embodiment, the transfer arm reaching through the port 30 will place the wafer 48 on three pins 50 like those used in the transfer arm itself. (Note that the port 30 preferably has enough vertical height to permit some vertical travel while the arm 28 is extended through port 30, so that arm 28 can move vertically to lift a wafer from or deposit a wafer onto pins 50 inside the processing chamber.)

Alternatively, the processing chamber may include a fixture having spaced sloped ledges like the ledges 16 inside the transfer box, or may have other mechanical arrangements to receive the wafer. However, in any case, the arrangement used to receive the transferred wafer must have clearance on the underside of the wafer (at least at the time of transfer), so that the transfer arm 28 can reach in on the underside of the wafer to emplace or remove it. If pins 50 are used to receive the transferred wafer, it may be desirable to provide a bellows motion or a vacuum feedthrough in order to provide vertical motion of the wafer support pins inside the processing chamber. Thus, for example, where the processing chamber is a plasma etch or RIE (reactive ion etch) station, a feedthrough may be provided to position the wafer 48 onto a susceptor after the transfer arm 28 has been withdrawn out of the way of the wafer.

In any case, the transfer arm 28 is preferably withdrawn, and the isolation gate over port 30 closed, while processing proceeds. After processing is finished, the isolation gate over port 30 is opened again, the arm 28 is extended again, the elevator drive motor 32 is operated briefly so that the arm 28 picks up the wafer 48, and the arm drive motor 34 is again operated to bring the transfer arm 28 back into the home position. The elevator drive motor 32 is then operated to bring the transfer arm 28 to the correct height to align the wafer 48 with the desired slot inside the wafer carrier. The arm drive motor 34 is then operated to extend the transfer arm 28 into the wafer carrier 10, so that the wafer 48 which has just been processed is sitting above its pair of ledges 60. The elevator drive motor 32 is then briefly operated to lower the transfer arm 28, so that the wafer is resting on its own ledges 60, and the arm drive motor 34 is then operated to retract the transfeer arm 28 to home position. The sequence of steps described above is then repeated, and the transfer arm 28 selects another wafer for processing.

Note that, with the mechanical linkage of the transfer arm 28 and arm support 44 described above, the wafers being transferred will move in exactly a stright line if the center to center lengths of transfer arm 28 and arm support 34 are equal. This is advantageous because it means that the side of the wafer being transferred will not bump or scrape against the sides of the box 10 when the wafer is being pulled out of or pushed into the box. That is, the clearances of the wafer carrier box can be relatively small (which helps to reduce particulate generation by rattling of the wafers during transport in the carrier) without risking particulate generation due to abrasion of the wafers against the metal box sides.

Processing continues in this fashion, wafer by wafer, until all the wafers inside the carrier 10 (or at least as many of them as desired) have been processed. At that point the transfer arm 28 is returned empty to its home position and lowered below the lower edge of the door 14, and the isolation gate over port 30 is closed. The door opening shaft 24 is now rotated to close door 14, and provide initial contact for the vacuum seals between door 14 and the flat front surface of carrier 10, so that the carrier is ready to be sealed (by pressure differential) as the pressure inside the load lock is increased. The load lock 12 can now be pressurized again. When the differential sensor of the vacuum gauge 62 determines that the pressure has come up to atmospheric, the load lock lid 20 can be opened and the wafer carrier 10 (which is now sealed by differential pressure) can be manually removed. In the preferred embodiment, a folding handle 11 is provided on the top side of the carrier, to assist in this manual removal without substantially increasing the volume required for the carrier inside the load lock.

After the carrier has been removed, it can be carried around or stored as desired. The seals 13 will maintain a high vacuum in the carrier meanwhile, so that particulate transport to the wafer surfaces (and also adsorption of vapor-phase contaminants) is minimized.

Note that the wafer carrier also includes elastic elements 27 mounted in its door. These elastic elements exert light pressure against the wafers 48 when the door 14 is closed, and thus restrain them from rattling around and generating particulates. The elastic element 27 is configured as a set of thin steel leaf springs (each having a bent and notched end to hold the edge of one wafer) in the embodiment shown, but other mechanical structures (e.g. a protruding bead of an elastic polymer) could alternatively be used to configure this. Where the wafers used have flats, a flat contact surface 29 is preferably provided on the inner back surface of the wafer carrier box 10 for the slice flats to be pressed against.

Note also that the ledges 60 on the sidewalls of the carrier box 10 are tapered. This helps to assure that contact with the supported surface of the wafer is made over a line only, rather than over any substantial area. This reduces wafer damage and particulate generation during transport. This also assists in damping out the accumulation of positioning errors, as discussed.

The load lock lid 20 preferably has a window in it, to permit operator inspection of any possible mechanical jams.

An advantage of the present invention is that, in the case of many possible mechanical malfunctions, the door of the wafer carrier 10 can be closed before attempts are made to correct the problem. For example, if somehow the transfer arm 28 picks up a wafer so that the wafer is not sitting properly on all three of the pins 50, the door drive motor 26 can be operated to close the door 14 before any attempts are made to correct the problem. Similarly, port 30 can be closed if the transfer arm 28 can be retracted into home position. It may be possible to correct some such mechanical misalignment problems simply by deviating from the normal control sequence. For example, the position of a wafer 48 on transfer arm 28 may in some cases be adjusted by partially extending the transfer arm 28, so that the edge of wafer 48 just touches the outside of door 14, or of the isolation gate over port 30. If this does not work, the load lock 12 can be brought back up to atmospheric pressure (with the door 14 of wafer carrier 10 closed) and the load lock lid 20 opened so that the problem can be manually corrected.

Note that all of the operations described above can be very easily controlled. That is, no servos or complex negative feedback mechanisms are needed. All four of the motors described are simple stepper motors, so that multiple stations according to the present invention can be controlled by a single microcomputer. The mechanical stability of the system as a whole—i.e. the inherent correction of minor positioning errors provided by the tapered pins of the wafer supports, by the slope of the wafer support ledges in the wafer carrier, and by the flat on the backwall of the wafer carrier—helps to prevent accumulation of minor errors, and facilitates easy control.

This advantage of simple control is achieved in part because good control of mechanical registration is achieved. As noted, the docking of the carrier 10 with platform 18 provides one element of mechanical registration, since the location of the platform 18 with respect to the transfer arm 28 can be accurately and permanently calibrated. Similarly, the wafer carriers 10 do not need to be controlled on each dimension, but merely need to be controlled so that the location and orientation of the support shelves 60 are accurately known with the respect to the bottom (or other portion) of the box which mates with support platform 18. As described above, this is preferably accomplished by having channels which the wafer carrier slides into intil it rests on the platform 18, but many other mechanical arrangements could be used instead.

Similarly, mechanical registration must be achieved between the home position of the transfer arm 28 and the support pins 50 (or other support configuration) which the wafer will be docked to inside the processing chamber. However, this mechanical registration should be a simple one-time setup calibration.

Note that angular positioning will be preserved by the box itself: as was noted, whenever the door 14 is closed, spring elements inside it will press the wafers 48 against the flat on the interior back surface of the box.

Optionally, the wafer carrier 10 could be provided with a quick-connect vacuum fitting, to permit separate pumpdown on the carriers 10. However, in the presently preferred embodiment this is omitted, since it is not necessary and since it simply provides another source of possible unreliability.

Note that the load lock mechanism described need not be used solely with vacuum-tight wafer carriers, although that is the most preferred embodiment. This load lock can also be used with wafer carriers which carry atmospheric pressure inside. Although this is not the most preferred embodiment, it still carries substantial advantages, as is discussed above, over prior art load lock operations.

It should be noted that a wafer carrier as described can be made in different sizes, to carry any desired number of wafers. Moreover, a wafer carrier according to the present invention can be used to carry or store any desired number of wafers, up to its maximum. This provides additional flexibility in scheduling and process equipment logistics.

Thus, the present invention provides all of the advantages listed above, and others besides. The present invention can be very widely modified and varied, and its scope is not limited except as specified in the claims.

What is claimed is:

1. In an apparatus for storage and transport of wafers;
an evacuable and transportable housing for containing an array of wafers;
said housing having an access port therein for accessing the wafers contained within said housing;
closure means for closing and sealing said access port in said housing; and
means for producing a pressure differential between the pressure of the surrounds of said housing relative to the subatmospheric pressure contained within said housing to cause said closure means to be urged into gaseous sealing engagement with the evacuated housing by atmospheric pressure, whereby the wafers are contained in an evacuated transportable housing means for transport and storage at atmospheric pressure.

2. The apparatus of claim 1 including:
wafer transfer means operable at subatmospheric pressure through said wafer access port into the evacuated housing means for transferring wafers between said evacuated housing and other regions at subatmospheric pressure.

3. In an apparatus for processing wafers at subatmospheric pressure the steps of:
wafer container means for containing and transporting an array of wafers at subatmospheric pressure when said container means is surrounded by atmospheric pressure;
said wafer containing means having a wafer access port therein for accessing the wafers contained within said container means;
closure means for closing said access port and for sealing said access port in gas-tight relationship at least partially by the surrounding atmospheric pressure exerting a closing force on said closure means;
wafer processing chamber means for processing wafers at subatmospheric pressure;
vacuum load lock chamber means for introducing the wafers to be processed into said wafer processing chamber means;
means operable within said vacuum load lock chamber means at subatmospheric pressure for removing said closure means from said wafer access port to expose the wafers to the subatmospheric pressure within said vacuum load lock chamber means;
wafer transfer means operable within said vacuum load lock chamber at subatmospheric pressure for transferring wafers between said wafer containing means and regions of the processing chamber at subatmospheric pressure;
means operable within said vacuum load lock chamber for placing said closure means over said wafer access port; and
means for raising the pressure of the atmospher surrounding said evacuated wafer containing means to atmospheric pressure such that such closure means is held in gas-tight sealing engagement over said wafer access port at least partially by the surrounding atmospheric pressure.

4. An evacuable wafer transport and storage box comprising:

a generally rectangular sidewall frame structure for containing an axial array of wafers;

a generally rectangular cover plate for covering one side of said rectangular sidewall frame structure; and a sealing ring for disposition in between said cover plate and said sidewall frame structure at the lip of said sidewall frame structure for sealing said cover plate to said sidewall frame structure in a gas-tight manner.

5. In a method for storage and transport of wafers, the steps of:

evacuating a transportable housing containing an array of wafers and its surrounds to subatmospheric pressure;

placing and sealing a closure over an access port in the evacuated housing at subatmospheric pressure for closing the housing; and raising the pressure of the surrounds of the closed and sealed housing to atmospheric pressure relative to the subatmospheric pressure on the interior of said housing to cause said closure to be urged into gaseous sealing engagement with the evacuated housing by atmospheric pressure, whereby the wafers are contained in an evacuated transportable housing for transport and storage at atmospheric pressure.

6. The method of claim 5 including the step of:

passing a wafer transfer member at subatmospheric pressure through the wafer access port into the evacuated housing for transferring wafers between the evacuated housing and other regions at subatmospheric pressure.

7. In a method of transferring and processing wafers at subatmospheric pressure, the steps of:

containing and transporting an array of wafers within an evacuated housing surrounded by atmospheric pressure, such housing having a wafer access port closed by a closure held in sealing engagement at least partially by the surrounding atmospheric pressure;

introducing the evacuated housing into a vacuum load lock chamber;

removing the closure from the wafer access port within the vacuum load lock chamber at subatmospheric pressure to expose the wafers to the subatmospheric pressure within the vacuum load lock chamber;

transferring wafers between the housing and regions of the processing chamber at subatmospheric pressure;

placing a closure over the wafer access port; and raising the pressure of the atmosphere surrounding the evacuated housing to atmospheric pressure such that the closure is held in gas-tight sealing engagement over the wafer access port at least partially by the surrounding atmospheric pressure.

* * * * *